(12) United States Patent
Xu et al.

(10) Patent No.: US 10,697,055 B2
(45) Date of Patent: Jun. 30, 2020

(54) EVAPORATING DEVICE AND EVAPORATING METHOD

(71) Applicants:SHANGHAI TIANMA MICRO-ELECTRONICS CO., LTD., Shanghai (CN); TIANMA MICRO-ELECTRONICS CO., LTD., Shenzhen (CN)

(72) Inventors: Jian Xu, Shanghai (CN); Yaoyang Liu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 245 days.

(21) Appl. No.: 15/605,859

(22) Filed: May 25, 2017

(65) Prior Publication Data

US 2017/0260621 A1 Sep. 14, 2017

(30) Foreign Application Priority Data

Dec. 23, 2016 (CN) .......................... 2016 1 1203536

(51) Int. Cl.
*C23C 14/24* (2006.01)
*C23C 14/04* (2006.01)

(52) U.S. Cl.
CPC ............ *C23C 14/24* (2013.01); *C23C 14/042* (2013.01)

(58) Field of Classification Search
CPC .............................. C23C 14/24; C23C 14/042
See application file for complete search history.

(56) References Cited

U.S. PATENT DOCUMENTS

| 5,164,104 | A | * | 11/1992 | Kobayashi | ........ C04B 35/58042 |
|---|---|---|---|---|---|
|  |  |  |  |  | 252/62.53 |
| 2015/0013599 | A1 | * | 1/2015 | You | ........ B05C 21/005 |
|  |  |  |  |  | 118/504 |

FOREIGN PATENT DOCUMENTS

| WO | 2016007214 A | 1/2016 |  |
|---|---|---|---|
| WO | WO-2016007214 A1 | * 1/2016 | ........ H01J 37/32366 |
| WO | 2016007214 A1 | 1/2017 |  |

OTHER PUBLICATIONS

"Halbach array" as accessed from https://web.archive.org/web/20151221045635/https://en.wikipedia.org/wiki/Halbach_array[Jun. 10, 2019 1:22:59 PM] on Jun. 10, 2019, version published May 21, 2015 (Year: 2015).*

* cited by examiner

*Primary Examiner* — Kelly M Gambetta
(74) *Attorney, Agent, or Firm* — Alston & Bird LLP

(57) ABSTRACT

Embodiments of the present disclosure disclose an evaporating device and an evaporating method. The evaporating device comprises: a Halbach magnet array and a mask setting region. A magnetization direction of at least part of the Halbach magnet array precesses clockwise or counterclockwise, so that magnetic fields having different magnetic fields are formed at two sides of the Halbach magnet array; and the mask setting region is disposed within the magnetic field at one side of the Halbach magnet array. The mask of the ferromagnetic material is placed in the evaporating device provided by the embodiments of the present disclosure. The mask is subject to an attractive force of the Halbach magnet array.

11 Claims, 13 Drawing Sheets

EVAPORATING DEVICE AND EVAPORATING METHOD

CROSS-REFERENCE TO RELATED APPLICATIONS

This application claims priority to a Chinese patent application No. CN201611203536.9, filed on Dec. 23, 2016, and entitled "Evaporation Device and Evaporation Method", the disclosure of which is incorporated herein by reference in entirety.

TECHNICAL FIELD

The present application relates to evaporation technologies, and more particularly, to an evaporating device and an evaporating method.

BACKGROUND

Evaporation is a process of putting a substance to be filmed in vacuum for evaporation or sublimation so that the substance is separated out on a surface of a workpiece or a substrate. Heating an evaporation material and coating the same on the substrate in a vacuum is referred to as a vacuum evaporation, or vacuum coating. The vacuum coating is applied to manufacturing processes of devices (such as a display panel) in most cases.

In the evaporation process of a display panel, a mask is used for shielding a particular region of a glass substrate so that an evaporation material is separated out in a non-shielding region to form a film. In theory, the surface of the mask is parallel to the glass substrate, and in this case, an evaporation result completely corresponds to the mask and conforms to a design.

However, in reality, since an edge of the mask is fixed to a support frame and the mask is extremely thin (the thickness of the mask is dozens of microns), the deformation of the mask caused by its own gravity action cannot be ignored. Under the effect of the deformation, a film obtained on the glass substrate deviates from an expected situation, so that the evaporation effect of the evaporating device is poor. In addition, in the process of fixing the mask by the evaporating device, when variation of force applied to the mask in a vertical direction is large, the mask may hit against the glass substrate at a high speed, which not only may damage the glass substrate and the mask, but also may result in a problem of scratch of a photo-spacer (PS) on the glass substrate.

SUMMARY

The present disclosure provides an evaporating device and an evaporating method to achieve an objective of preventing a mask from deforming due to its own weight and improving an evaporation effect of the evaporating device.

In a first aspect, an embodiment of the present disclosure provides an evaporating device, which includes: a Halbach magnet array and a mask setting region.

A magnetization direction of at least part of the Halbach magnet array precesses clockwise or counter-clockwise, so that magnetic fields having different magnetic field strength are formed at two sides of the Halbach magnet array.

The mask setting region is disposed within the magnetic field at one side of the Halbach magnet array.

In a second aspect, an embodiment of the present disclosure further provides an evaporating method, which includes:

providing an evaporation chamber;

providing an evaporating device, the evaporating device includes: a Halbach magnet array and a mask setting region; wherein a magnetization direction of at least part of the Halbach magnet array precesses clockwise or counter-clockwise, so that magnetic fields having different magnetic field strength are formed at two sides of the Halbach magnet array; and the mask setting region is disposed within the magnetic field at one side of the Halbach magnet array;

transporting the mask to a preset position within the mask setting region, wherein a material of the mask comprises ferromagnetic material;

fixing the mask by the evaporating device; and conducting evaporation by using the evaporation chamber.

DETAILED DESCRIPTION

The present disclosure is further described in detail in the following with reference to the accompanying drawings and embodiments. It is to be understood that the embodiments set forth herein are merely intended to interpret the present disclosure and are not intended to limit the present disclosure. In addition, it is also to be noted that for ease of description, drawings merely show parts related to the present disclosure instead of all parts.

Figure 1A:
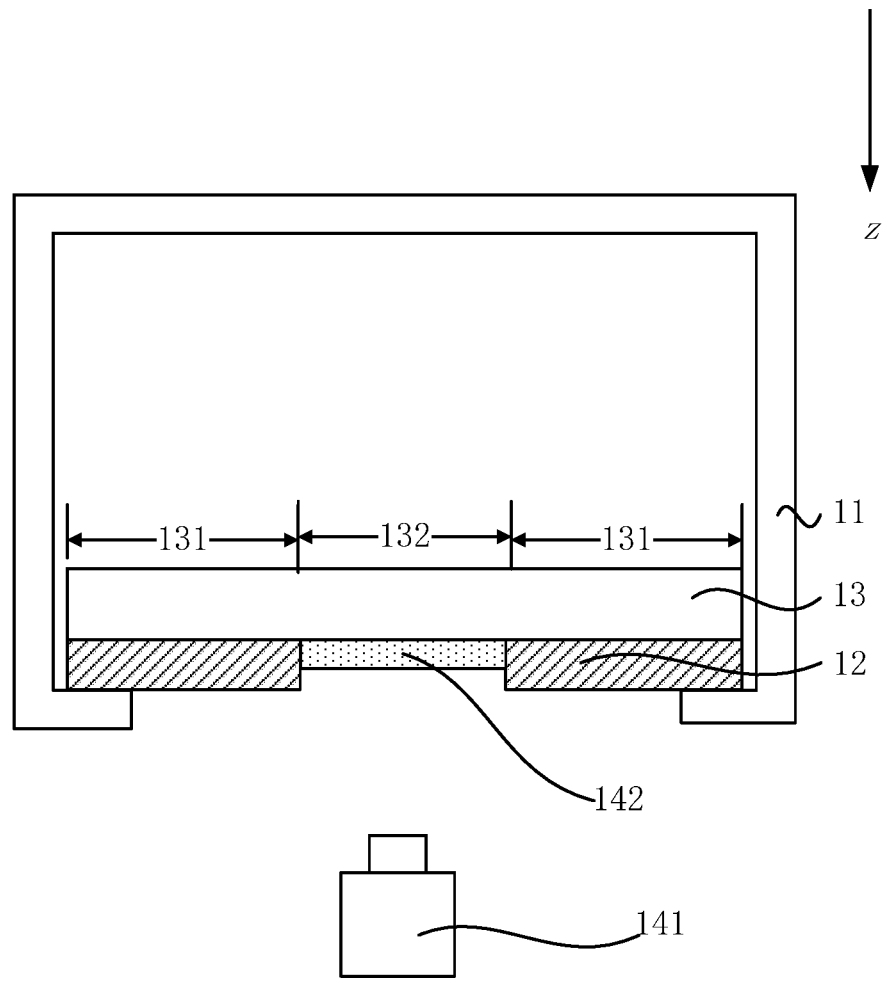
FIG. 1A is an ideal schematic structural diagram of an existing evaporating device in an evaporation process.
Figure 1B:
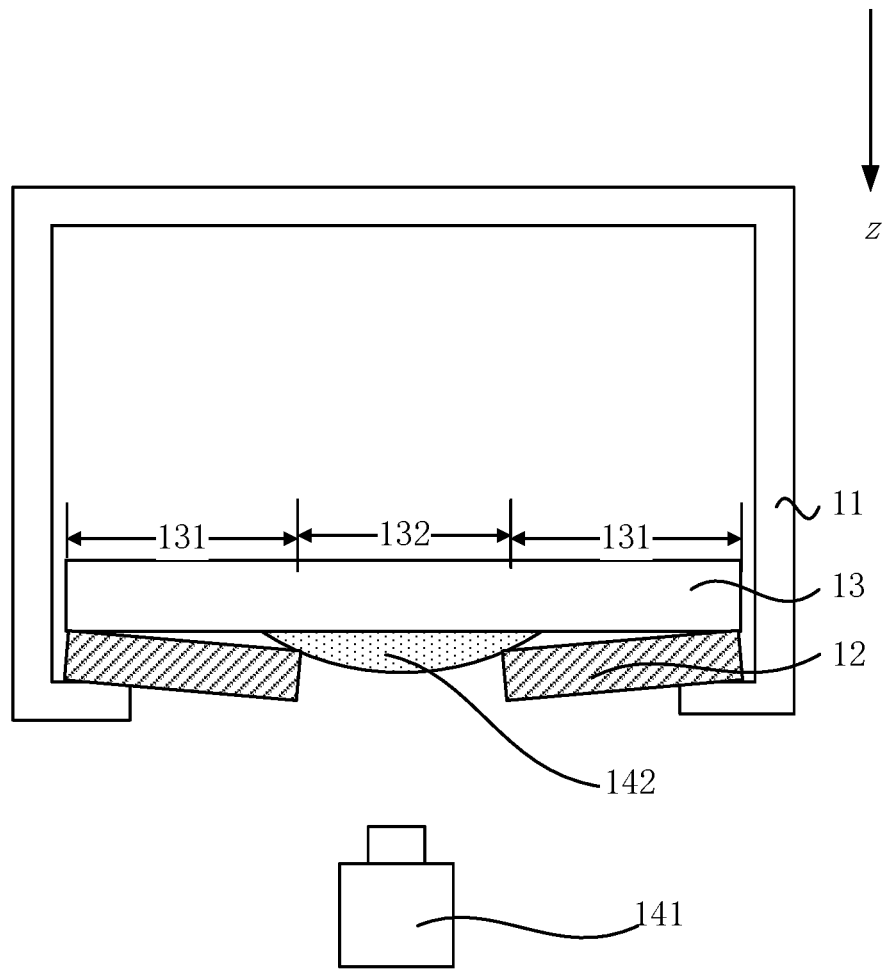
FIG. 1B is a practical schematic structural diagram of an existing evaporating device in an evaporation process.

FIG. 1A is an ideal schematic structural diagram of an existing evaporating device in an evaporation process, and FIG. 1B is a practical schematic structural diagram of an existing evaporating device in an evaporation process. Referring to FIG. 1A and FIG. 1B, the evaporating device includes a support frame 11 and a mask 12. An edge of the mask 12 is fixed to the support frame 11, at one side of the mask 12 positioned on a glass substrate 13. An evaporation source 141 is positioned at one side of the mask 12 away from the glass substrate 13. The mask 12 is a hollowed structure for shielding a particular region 131 of the glass substrate 13 and exposing a to-be-evaporated region 132 of the glass substrate 13, so that a formed film 142 is separated out in the to-be-evaporated region 132 after an evaporation material is ejected from the evaporation source 141. Comparing FIG. 1A with FIG. 1B, in practical use, since the edge of the mask 12 is fixed to the support frame 11, non-ignorable deformation of the mask 12 may occur under the action of its own weight, so that a gap exists between the mask 12 and the glass substrate 13. When the evaporation material separates the formed film 142 out in the to-be-evaporated region 132 of the glass substrate 13, a small amount of the formed film may be separated out into the gap between the mask 12 and the glass substrate 13, which results in a poor evaporation effect of the evaporating device.

When an existing evaporating device is utilized to form, by means of evaporation, film layers of red, green and blue pixel arrays, edges of pixel units of a display panel may overlap because the abovementioned deviation may occur in the film layers in the evaporation process. Undoubtedly, this will have a negative effect on a display effect of the display panel, and even damage the display panel.

Figure 2A:
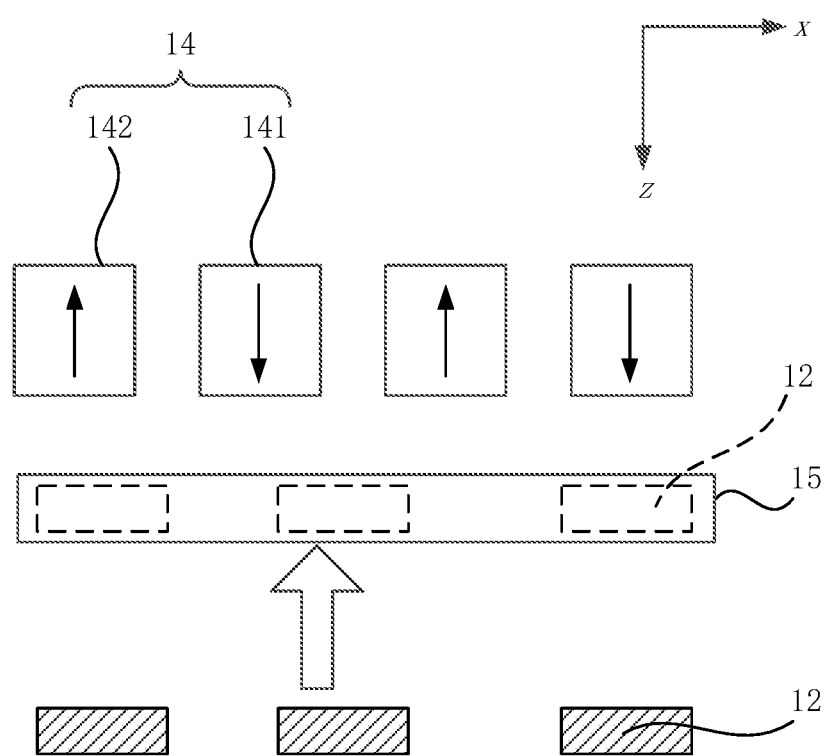
FIG. 2A is a schematic structural diagram of another existing evaporating device.

FIG. 2A is a schematic structural diagram of another existing evaporating device. Referring to FIG. 2A, the evaporating device includes a magnet array 14 for attracting the mask 12 to a preset position 15. The magnet array 14 includes a plurality of first magnet blocks 141 whose magnetization direction is the same as a z-axis positive direction and a plurality of second magnet blocks 142 whose magnetization direction is the same as a z-axis negative direction (exemplarily in FIG. 2A, the magnet array 14 merely includes two first magnet blocks 141 and two second magnet blocks 142). The first magnet block 141 and the second magnet block 142 are alternately arranged to form a plurality of rows and a plurality of columns in an array structures.

The magnetic field strength of the magnetic fields formed at two sides of the existing magnet array 14 are the same, and damping of the attractive force between the magnet array and the mask 12 is extremely rapid. In an actual evaporation, in the process of using the magnet array 14 to attract the mask 12 to the preset position 15, with constant change of the position of the mask 12, the distance between the mask 12 and the magnet array 14 changes constantly, and the attractive force applied to the mask 12 from the magnet array 14 increases exponentially with the closing of the distance between the mask 12 and the magnet array 14. The larger the attractive force applied to the mask 12 from the magnet array 14 is, the larger the acceleration of the mask 12 is.

Figure 2B:
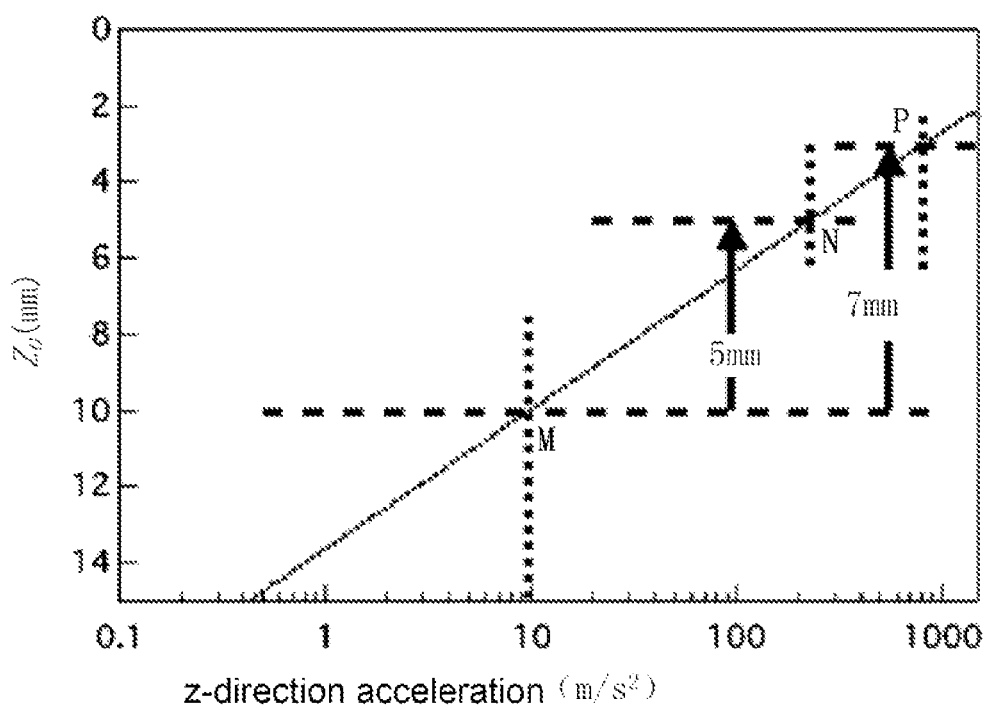
FIG. 2B is a schematic diagram showing the mask's deviation from the magnet array as a function of the variation of the mask's z-direction acceleration in an existing evaporating device.

A magnitude of the acceleration of the mask 12 may reflect a magnitude of the attractive force applied to the mask 12 from the magnet array 14. Therefore, the attractive force applied to the mask 12 from the magnet array 14 is directly connected with the acceleration, and the acceleration is decomposed into the z-axis and the x-axis components, so that a component of the acceleration in the z-axis direction (denoted by a z-direction acceleration) may be obtained for the mask 12. FIG. 2B is a schematic diagram showing a relationship of mask's variation of the z-direction acceleration as a function of the distance between the mask and the magnet array in the existing evaporating device. An abscissa in FIG. 2B represents the z-direction acceleration of the mask, a unit thereof being meter per second squared (m/s$^2$). An ordinate represents a distance $Z_0$ between the mask and the magnet array, a unit thereof being millimeter (mm). Referring to FIG. 2B, moving from Point M to Point N (distance between is 5 mm), the mask acceleration is increased in z-direction, from 9.8 m/s$^2$ to 227 m/s$^2$. Moving from Point N to Point P (distance between is 2 mm), the mask acceleration is increased, in z-direction, from 227 m/s$^2$ to 811 m/s$^2$. Combining FIG. 2A and FIG. 2B, at such a large acceleration, the mask 12 may hit the glass substrate at a high speed, which may cause the mask 12 to wrinkle. Additionally, the glass substrate includes a photo-spacer (PS), which may scratch the PS, thereby having a negative effect on the display quality of the display panel.

An embodiment of the present disclosure provides an evaporating device. The evaporating device includes a Halbach magnet array and a mask setting region. The magnetization direction of at least part of the Halbach magnet array precesses clockwise or counter-clockwise, so that magnetic fields having different magnetic field strength are formed at two sides of the Halbach magnet array. The mask setting region is disposed within the magnetic field at one side of the Halbach magnet array.

When in specific setting, the materials of the Halbach magnet array may include, for example, Nd—Fe—B magnet, samarium cobalt magnet, or alnico magnet, etc. Optionally, the evaporating device may further include a mask, whose materials maybe ferromagnetic. Within the mask setting region, the mask made from ferromagnetic material may be subject to an attractive force slowly changing in size along the direction away from the Halbach magnet array. Under the combined action of the attractive force and gravity, the mask hardly deforms, thereby solving the problem of deformation of the mask in the existing evaporating device caused by its own weight having a negative effect on the evaporation effect.

The attractive force F applied to the ferromagnetic material having magnetic moment m in an inhomogeneous magnetic field B with a magnetic field gradient and satisfies a function as below:

$$F = (m \cdot \nabla)B = m_x \frac{\partial B}{\partial x} + m_y \frac{\partial B}{\partial y} + m_z \frac{\partial B}{\partial z}. \qquad (1)$$

As can be known from the above formula that the attractive force applied to the ferromagnetic material in an inhomogeneous magnetic field not only is related to a magnetic induction strength, but also is related to a magnetic field strength gradient at this point. The variation of the magnetic field gradient at one side of the Halbach magnet array in this embodiment is smaller, so that a movement speed of the mask may be effectively controlled, the variation of force in a vertical direction is smaller in the process of moving the mask to the preset position, and thus the mask may not hit against the glass substrate at a high speed, thereby preventing the mask from clash damage and from a PS scratching. In addition, in this embodiment, the magnetic field strength gradient at the side where the magnetic field strength of the Halbach magnet array is larger is smaller than that at the side where the magnetic field strength is smaller. Therefore, to more effectively control the movement speed of the mask setting region, optionally, the mask setting region is disposed at the side where the magnetic field strength of the Halbach magnet array is larger.

To ensure the attractive force applied to the mask from the Halbach magnet array to be more uniform, optionally, the magnetization direction of the Halbach magnet array may precess clockwise or counter-clockwise at a constant rotational angular velocity.

According to the embodiments of the present disclosure, magnetic fields with specific distribution are formed at two sides of the Halbach magnet array, and the mask setting region is disposed within the magnetic field at one side of the Halbach magnet array. Within the mask setting region, the mask made from ferromagnetic materials may be subject to an attractive force slowly changing in strength along a direction away from the Halbach magnet array. Under the combined action of the attractive force and a gravity, the mask hardly deforms, thereby solving the problem of deformation of the mask in the existing evaporating device caused by its own weight having a negative effect on the evaporation effect, and achieving the objective of preventing the mask from deforming due to its own weight and improving the evaporation effect of the evaporating device. Meanwhile, in the process of attracting the mask by the evaporating device provided by the embodiments of the present disclosure to the preset position, a variation of the attractive force of the Halbach magnet array on the mask is smaller along a direction away from the Halbach magnet array, and the attractive force of the Halbach magnet array on the mask is almost zero along a direction parallel to a plane where the Halbach magnet array is, so that the mask may not hit against a glass substrate at a high speed and may not displace in a horizontal direction, thereby preventing the mask from damaging and a photo-spacer (PS) from scratching. In addition, the evaporating device provided by the present disclosure is simple in structure, low in fabricating cost, and suitable for large-scale production and use.

Figure 3:
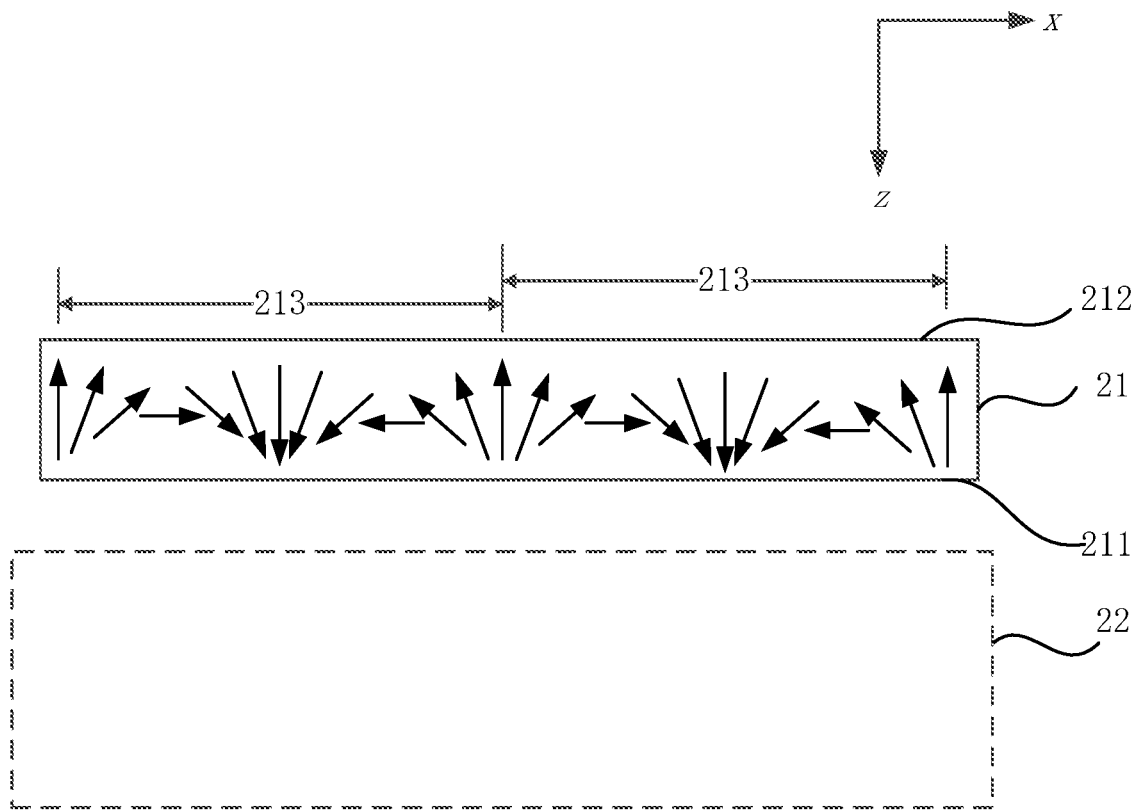
FIG. 3 is a schematic structural diagram of an evaporating device according to an embodiment of the present disclosure.

FIG. 3 is a schematic structural diagram of an evaporating device according to an embodiment of the present disclosure. The evaporating device includes a Halbach magnet array 21 and a mask setting region 22. A magnetization direction of at least part of the Halbach magnet array 21 precesses clockwise or counter-clockwise, so that magnetic fields having different magnetic field strengths are formed at two sides of the Halbach magnet array 21. In FIG. 3, the magnetization direction of the Halbach magnet array 21 precesses clockwise, so that the magnetic field at a side of a lower surface 211 of the Halbach magnet array 21 is greater than that of the magnetic field at a side of an upper surface 212 of the Halbach magnet array 21. The mask setting region 22 may be disposed within the magnetic field at one side of the Halbach magnet array 21. In FIG. 3, the mask setting region 22 is exemplarily disposed at one side, having a larger magnetic field strength, of the Halbach magnet array 21, that is, inside the magnetic field at a lower surface 211 of the Halbach magnet array 21. It is to be noted that when in actual design, the entire mask may be set to be positioned within the magnetic field formed by the Halbach magnet array 21, alternatively, only a part of the mask may be set to be positioned within the magnetic field formed by the Halbach magnet array 21, that is, the Halbach magnet array 21 is set only for a certain part of the mask, so that this part may be subject to the attractive force from the Halbach magnet array 21.

In actual design, there are multiple design solutions for the Halbach magnet array 21. For example, the Halbach magnet array 21 includes at least one magnetized unit. The magnetization direction of part of the Halbach magnet array corresponding to each of the magnetized units continuously precesses clockwise or counter-clockwise by 360 degrees. Exemplarily, as shown in FIG. 3, the Halbach magnet array 21 includes two magnetized units 213. The magnetization direction of part of the Halbach magnet array 21 corresponding to either of the magnetized units 213 continuously precesses clockwise by 360 degrees.

It is noted that when in specific setting, the thickness L of the Halbach magnet array 21 and the length T of the magnetized unit 213 may be arbitrary values, which is not limited by the present disclosure. However, it is to be noted that the material and the size of the Halbach magnet array 21 as well as the material and the size of the mask may affect the magnitude of the attractive force of the Halbach magnet array 21 on the mask.

Figure 4:
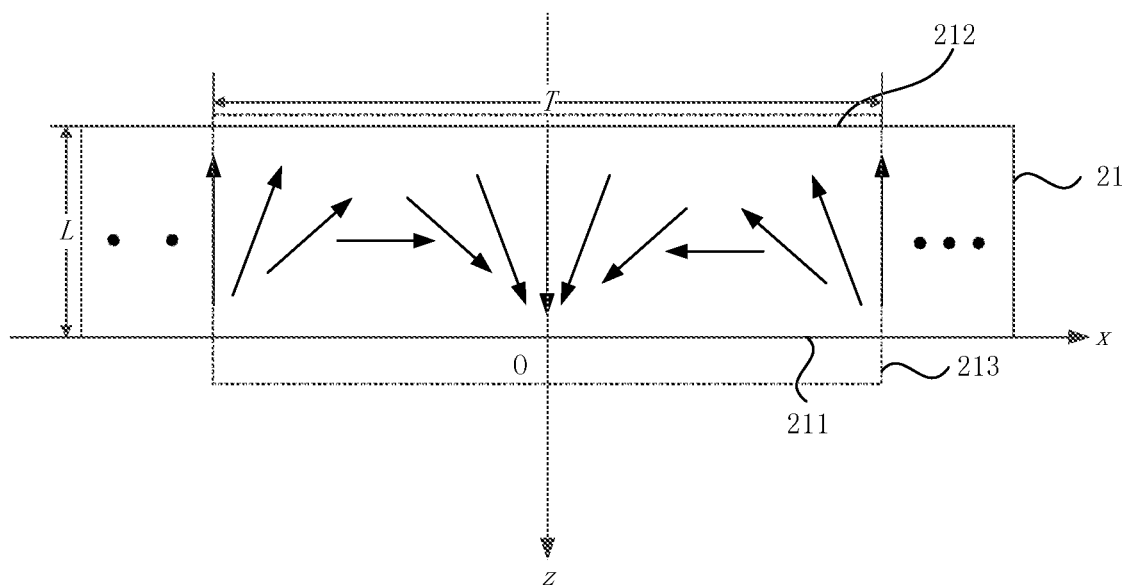
FIG. 4 is a schematic diagram showing derivation of a magnetized unit satisfying the requirement.

To allow each magnetized unit 213 in the Halbach magnet array 21 to preferably balance the gravity of the mask, conditions that the Halbach magnet array 21 needs to satisfy are deduced now. FIG. 4 is a schematic diagram showing derivation of a magnetized unit satisfying a condition. Referring to FIG. 4, the extending direction of the magnetized unit 213 is along x-axis, a direction that is perpendicular to a plane where the lower surface 211 of the magnetized unit 213 is and that keeps away from the upper surface 212 of the magnetized unit 213 is along z-axis, the x axis and the z axis intersect at Point O, which is an original of coordinates, and a y axis (not shown in FIG. 4) passes through Point O and is perpendicular to a plane defined by the x axis and the z axis.

Now considering a magnet which has an infinite length along the x-axis direction and the y-axis direction, as shown in FIG. 5, the magnetization direction of the magnet precesses clockwise at a constant rotational angular velocity $\omega$ on the plane defined by the x axis and the z axis, and a remnant magnetization vector $B_r$ of the magnetized unit 213 of the magnet is, $$B_r = (B_r \cos(\omega x), 0, -B_r \sin(\omega x)),$$

wherein $B_r$ is the remnant magnetization of the magnetized unit 213.

A component $B_x(X_0, Y_0, Z_0)$, on the x axis, of the total magnetic induction strength $B(X_0, Y_0, Z_0)$ generated by the Halbach magnet array 21 at a point $(X_0, Y_0, Z_0)$ in space is $$B_x(X_0, Y_0, Z_0) = B_r[1 - \exp(-\omega L)] \sin(\omega X_0) \exp(-\omega Z_0),$$

and a component $B_z(X_0, Y_0, Z_0)$, on the z axis, of the total magnetic induction strength $B(X_0, Y_0, Z_0)$ generated by the Halbach magnet array 21 at the point $(X_0, Y_0, Z_0)$ in space is $$B_z(X_0, Y_0, Z_0) = B_r[1 - \exp(-\omega L)] \cos(\omega X_0) \exp(-\omega Z_0),$$

wherein the L is the thickness of the Halbach magnet array 21. The above formula indicates that the total magnetic induction strength $B(X_0, Y_0, Z_0)$ generated by the Halbach magnet array 21 at the point $(X_0, Y_0, Z_0)$ in space is a function of the thickness L of the Halbach magnet array and the rotational angular velocity $\omega$ in the magnetization direction.

The attractive force F of the Halbach magnet array 21 on the mask positioned at the point $(X_0, Y_0, Z_0)$ is a component $F_x$ on the x axis, which is as follows:

$$F_x = 0.$$

The attractive force F of the Halbach magnet array 21 on the mask positioned at the point ($X_0$, $Y_0$, $Z_0$) is a component $F_z$ on the z axis, which is as follows:

$$F_z = \frac{-\omega V \chi_m}{\mu_0(1+\chi_m)} \{B_r[1-\exp(-\omega L)]\exp(-\omega Z_0)\}^2,$$

wherein $\chi_m$ is susceptibility of the mask, V is a volume of the mask, and $\mu_0$ is a permeability of vacuum.

To ensure the attractive force of the Halbach magnet array 21 on the mask to be uniform as much as possible, optionally, when a relative distance between the mask and the Halbach magnet array 21 varies, a variation $\Delta z$ of the distance between the mask and the Halbach magnet array 21 is at maximum in a process that the attractive force applied to the mask is increased from 0.5 time to 10 times of the gravity of the mask. In combination with the above setting condition and the foregoing formula, following formula may be obtained:

$$\Delta z = \frac{\ln 20}{2\omega}.$$

The above formula indicates that the smaller the rotational angular velocity $\omega$ in the magnetization direction is, the larger the variation $\Delta z$ of the distance between the mask and the Halbach magnet array 21 is, and the more slowly the attractive force of the Halbach magnet array 21 on the mask varies.

Further, in combination with the existing evaporation requirements, the variation $\Delta z$ of the distance between the mask and the Halbach magnet array 21 should be greater than or equal to a minimum value $\Delta z_{min}$ (~5 mm) in the process that the attractive force applied to the mask is increased from 0.5 time to 10 times of the gravity of the mask. In combination with $\Delta z \geq \Delta z_{min}$, following formula may be obtained:

$$\omega = \frac{\ln 20}{2\Delta z} \leq \omega_{max} = 300 \text{ m}^{-1},$$

T represents a length of the magnetized unit, then $T = 2\pi/\omega$, in this way, $T \geq 0.02$ m.

When in actual setting, it is needed to ensure that the attractive force of the Halbach magnet array 21 on the mask is greater than or equal to the gravity of the mask in the event that the distance $Z_0$ from the mask to the Halbach magnet array 21 is 0, and following formula may be obtained:

$$L \geq -\frac{1}{\omega}\ln\left(1 - \frac{1}{B_r}\sqrt{\frac{\rho g \mu_0(1+\chi_m)}{2\omega \chi_m}}\right),$$

wherein the $\rho$ is a density of the mask, and the g is gravitational acceleration. The above formula indicates that to ensure each magnetized unit 213 in the Halbach magnet array 21 to preferably balance the gravity of the mask, the smaller the rotational angular velocity $\omega$ in the magnetization direction is, the smaller the thickness L of the Halbach magnet array 21 can be, namely, the thinner the Halbach magnet array 21 will be.

In addition, the length T of the magnetized unit 213 along the x-axis direction should satisfy:

$$T \leq \frac{2\pi \chi_m B_r^2}{\rho g \mu_0(1+\chi_m)}.$$

In conclusion, for the Halbach magnet array 21 including a plurality of magnetized units 213 whose magnetization directions continuously precess clockwise or counter-clockwise by 360 degrees, to ensure each magnetized unit 213 in the Halbach magnet array 21 to preferably balance the gravity of the mask, optionally, the length T of the magnetized unit 213 satisfies the following formula:

$$0.02 \text{ m} \leq T \leq \frac{2\pi \chi_m B_r^2}{\rho g \mu_0(1+\chi_m)},$$

wherein $B_r$ is the remnant magnetization, $\rho$ is the density of the mask, g is gravitational acceleration, $\mu_0$ is the permeability of vacuum, and $\chi_m$ is susceptibility of the mask. The thickness L of the magnetized unit 213 satisfies the following formula:

$$L \geq -\frac{1}{\omega}\ln\left(1 - \frac{1}{B_r}\sqrt{\frac{\rho g \mu_0(1+\chi_m)}{2\omega \chi_m}}\right),$$

wherein $\omega$ is the rotational angular velocity in the magnetization direction, which satisfies $\omega = 2\pi/T$.

The mask made from ferromagnetic material is placed inside the evaporating device satisfying the above condition. The attractive force applied to the mask from the Halbach magnet array 21 is converted into the acceleration, and the acceleration is decomposed along the z-axis and the x-axis directions, so that a component of the acceleration in the z-axis direction (denoted by a z-direction acceleration) and a component of the acceleration in the x-axis direction (denoted by an x-direction acceleration) may be obtained for the mask.

Figure 5A:
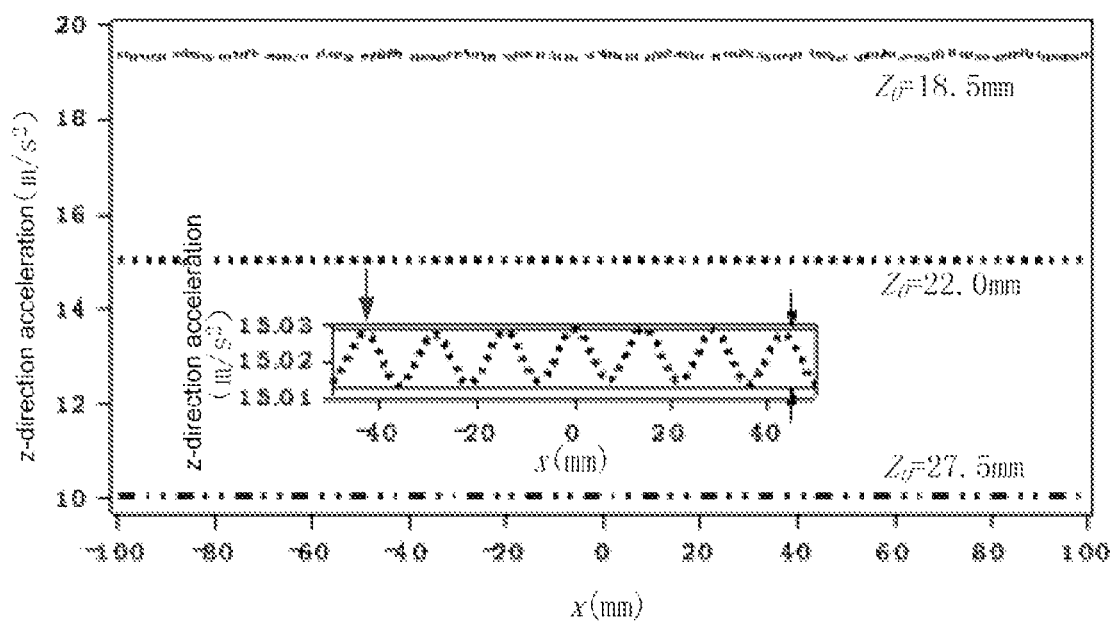
FIG. 5A is a schematic diagram showing distribution of the z-direction acceleration of the mask in the evaporating device in FIG. 4.

FIG. 5*a* is a schematic diagram showing distribution of the z-direction acceleration of the mask in the evaporating device in FIG. 4. In FIG. 5*a*, an abscissa represents an x-axis coordinate, a unit thereof being millimeter (mm); and an ordinate represents the z-direction acceleration of the mask, a unit being meter per second squared (m/s$^2$). Value $Z_0$ represents a distance from the mask to the Halbach magnet array 21. Referring to 5*a*, when Value $Z_0$ is different, the magnitude of the z-direction acceleration of the mask is different. The smaller the Value $Z_0$ is, the smaller the distance from the mask to the Halbach magnet array 21 is, and the larger the z-direction acceleration of the mask is. At a position where the distance from the Halbach magnet array 21 is 27.5 mm, the z-direction acceleration of the mask is about 9.8 m/s$^2$, and the attractive force applied to the mask from the Halbach magnet array 21 is approximately equal to the gravity of the mask. At a position where the distance from the Halbach magnet array 21 is 18.5 mm, the z-direction acceleration of the mask is about 19.5 m/s$^2$, and the attractive force applied to the mask from the Halbach magnet array 21 is approximately twice the gravity of the mask. This shows that in the process that the mask continuously moves under the attractive force of the Halbach magnet array 21, the variation of the attractive force applied to the mask by the Halbach magnet array 21 is relatively small.

FIG. 5 also includes an inside subgraph. The subgraph is an enlarged view showing distribution of the z-direction acceleration of the mask at positions of different x values when the distance $Z_0$ from the Halbach magnet array 21 is 22.0 mm. As can be seen from the subgraph in FIG. 5a, along the x-axis direction, although the z-direction acceleration of the mask fluctuates to a certain degree, a difference between a maximum value and an average value of the acceleration is only 0.01 m/s² which is within an error-allowable range and may be negligible.

Figure 5B:
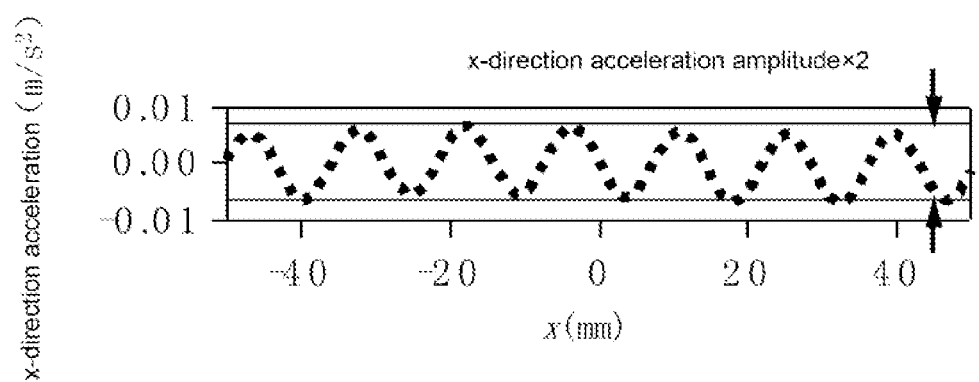
FIG. 5B is a schematic diagram showing distribution of an x-direction acceleration of the mask in the evaporating device in FIG. 4.

FIG. 5b is a schematic diagram showing distribution of an x-direction acceleration of the mask in the evaporating device in FIG. 4. In FIG. 5a, an abscissa represents an x-axis coordinate, a unit thereof being millimeter (mm); and an ordinate represents the x-direction acceleration of the mask, a unit thereof being meter per second squared (m/s²). It is to be noted that FIG. 5b is obtained at a position where the distance from the Halbach magnet array 21 is 22.0 mm. As can be seen from FIG. 5b, along the x-axis direction, within an error-allowable range, the x-direction acceleration of the mask is approximately equal to 0, that is, force applied to the mask in the x direction is almost zero.

According to the above technical solution, magnetic fields having different magnetic field strength are formed at two sides of the Halbach magnet array by using the Halbach magnet array including at least one magnetized unit whose magnetization direction precesses clockwise or counter-clockwise by 360 degrees, so that the mask setting region is disposed at one side of the Halbach magnet array. Within the mask setting region, the mask made from ferromagnetic material may be subject to an attractive force slowly changing in size that is along a direction away from the Halbach magnet array. Under the combined action of the attractive force and a gravity, the mask hardly deforms, thereby solving the problem of deformation of the mask in the existing evaporating device caused by its own weight having a negative effect on the evaporation effect, and achieving the objective of preventing the mask from deforming due to its own weight and improving the evaporation effect of the evaporating device. Meanwhile, in the process of attracting the mask to a preset position by the evaporating device provided by the embodiments of the present disclosure, a variation of the attractive force of the Halbach magnet array on the mask is smaller along the direction away from the Halbach magnet array, and the attractive force of the Halbach magnet array on the mask is almost zero along a direction parallel to a plane where the Halbach magnet array is, so that the mask may not hit against a glass substrate at a high speed, thereby preventing the mask from damaging and a photo-spacer (PS) from scratching.

Figure 6:
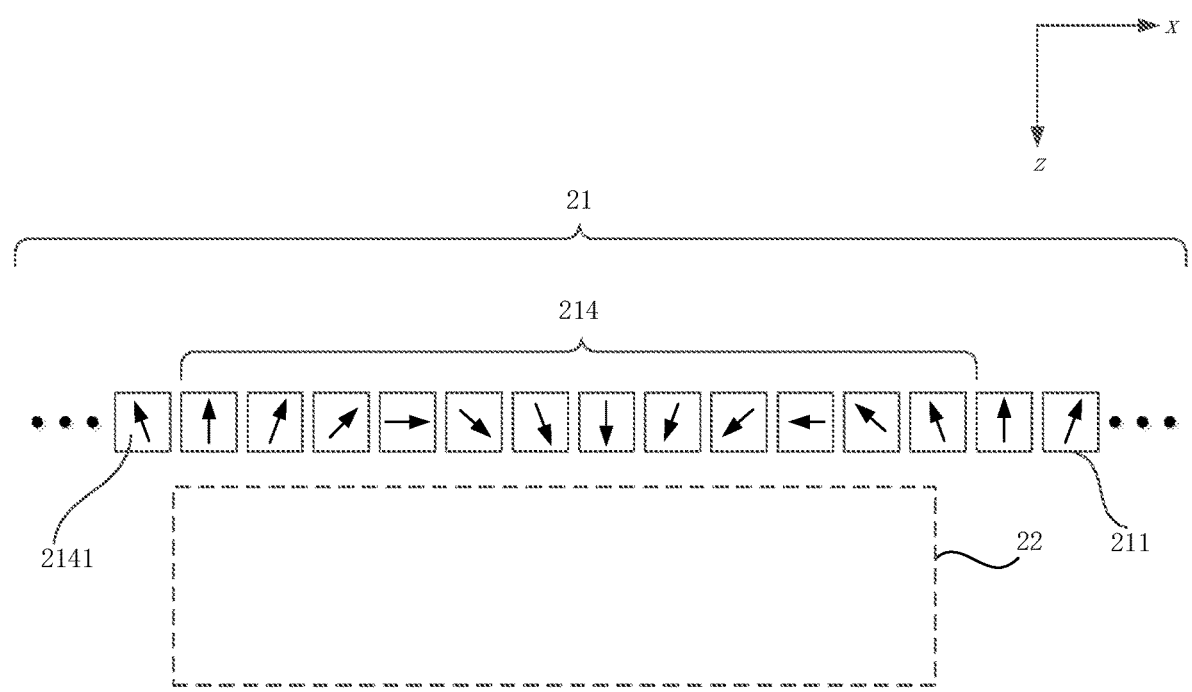
FIG. 6 is a schematic structural diagram of another evaporating device according to an embodiment of the present disclosure.

FIG. 6 is a schematic structural diagram of another evaporating device according to an embodiment of the present disclosure. The structure of the Halbach magnet array 21 in the evaporating device in FIG. 6 is different as compared with the foregoing technical solutions. Referring to FIG. 6, the Halbach magnet array 21 includes at least one magnet array unit 214, the magnet array unit 214 is composed of a plurality of magnet blocks 2141 having different magnetization directions. Magnetization directions of each of magnet blocks 2141 in the magnet array unit 214 are different, and along an arrangement direction of each of the magnet blocks 2141, the magnetization direction of the each of the magnet blocks 2141 continuously precesses clockwise or counter-clockwise by 360 degrees (exemplarily in FIG. 6, the magnetization direction of the each of the magnet blocks 2141 continuously precesses clockwise or counter-clockwise by 360 degrees). It is to be noted that in FIG. 6, a projection of each of the magnet blocks 2141 on the plane defined by the x axis and the z axis is a quadrate, which is merely a specific example of the present disclosure instead of limit to the present disclosure. When in actual design, the projections of the magnet blocks 2141 on the plane defined by the x axis and the z axis may be a quadrate, a round, an ellipse, a triangle, a trapezoid or a parallelogram, etc.

Similarly, when in specific setting, the thickness L of the Halbach magnet array 21 and the length T of the magnet array unit 214 may be arbitrary values, which is not limited by the present disclosure. However, it is to be noted that the material and the size of the Halbach magnet array 21 as well as the material and the size of the mask may affect the magnitude of the attractive force of the Halbach magnet array 21 on the mask.

Figure 7:
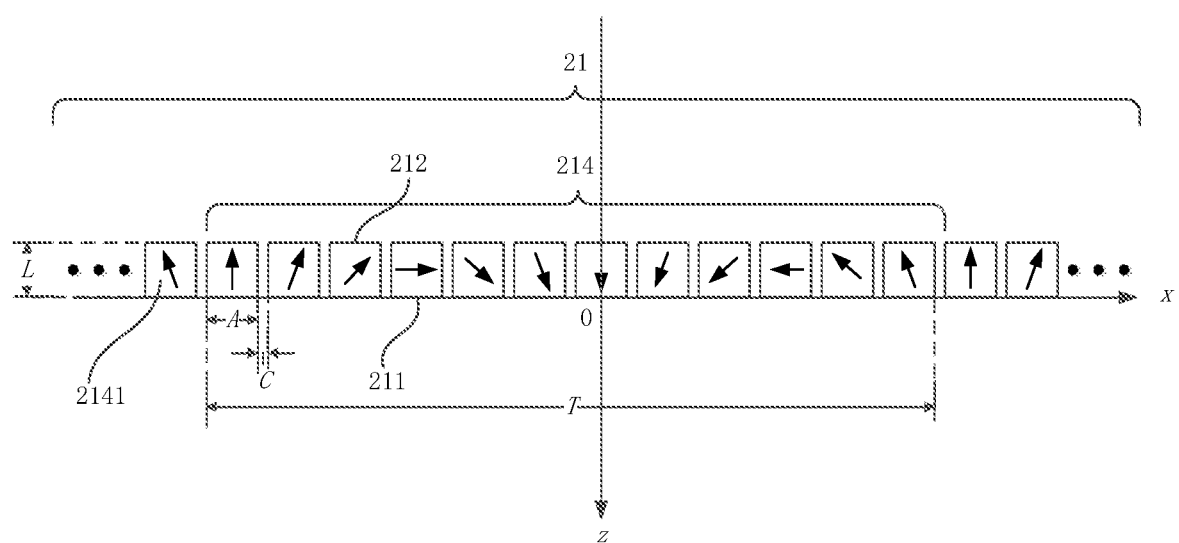
FIG. 7 is a schematic diagram showing derivation of a magnet array unit satisfying a condition.

To allow each magnet array unit 214 in the Halbach magnet array 21 to preferably balance the gravity of the mask, conditions that the Halbach magnet array 21 needs to satisfy are deduced now. FIG. 7 is a schematic diagram showing derivation of the magnet array unit 214 satisfying a condition. Referring to FIG. 7, the extending direction of the magnet array unit 214 serves as the x-axis direction, the direction that is perpendicular to a plane where the lower surface 211 of the magnet array unit 214 is and that keeps away from the upper surface 212 of the magnet array unit 214 serves as the z-axis direction, the x axis and the z axis intersect at Point O, which is an original of coordinates, and a y axis (not shown in FIG. 7) passes through Point O and is perpendicular to the plane defined by the x axis and the z axis.

Now considering a Halbach magnet array 21 which is arrayed along the x-axis direction and has an infinite length along the y-axis direction, as shown in FIG. 7, since the magnetic field strength of the magnetic field formed by the Halbach magnet array 21 in the y-axis direction is zero, a component $B_x$ $(X_0, Y_0, Z_0)$, on the x axis, of the total magnetic induction $B(X_0, Y_0, Z_0)$ generated by the Halbach magnet array 21 at a certain point $(X_0, Y_0, Z_0)$ in space is $$B_x(X_0, Y_0, Z_0) = \frac{B_r}{\pi} N \sin\left(\frac{\pi A}{N(A+B)}\right)$$
$$\sin\left(\frac{2\pi X_0}{N(A+B)}\right) \times \exp\left(\frac{-2\pi Y_0}{N(A+B)}\right)\left(1 - \exp\left(\frac{-2\pi L}{N(A+B)}\right)\right),$$

and a component $B_z$ $(X_0, Y_0, Z_0)$, on the z axis, of the total magnetic induction B $(X_0, Y_0, Z_0)$ generated by the Halbach magnet array 21 at the point $(X_0, Y_0, Z_0)$ in space is $$B_z(X_0, Y_0, Z_0) = \frac{B_r}{\pi} N \sin\left(\frac{\pi A}{N(A+B)}\right)$$
$$\cos\left(\frac{2\pi X_0}{N(A+B)}\right) \times \exp\left(\frac{-2\pi Y_0}{N(A+B)}\right)\left(1 - \exp\left(\frac{-2\pi L}{N(A+B)}\right)\right);$$

wherein $B_r$ is a remnant magnetization of the magnetic block 2141, A is the length of the magnetic block 2141, C is the distance between outer edges of two adjacent magnetic blocks 2141, N is the total number of the magnetic blocks included in a row of the magnet array unit 214, the length of the magnet array unit 214 is T, then T=N(A+C). The rotational angular velocity in a magnetization direction is ω, then $\omega=2\pi/T$. L is the thickness of the Halbach magnet array 21 (namely the thickness of the magnetic block 2141).

A component $F_x$, on the x axis, of the attractive force F of the Halbach magnet array 21 on the mask at the point ($X_0$, $Y_0$, $Z_0$) is:

$$F_x = 0.$$

A component $F_z$ on the z axis, of the attractive force F of the Halbach magnet array 21 on the mask positioned at the point ($X_0$, $Y_0$, $Z_0$) is:

$$F_z = \frac{-\omega V \chi_m}{\mu_0(1+\chi_m)}\left\{B_r \frac{\sin(\omega A/2)}{\omega(A+C)/2}[1-\exp(-\omega L)]\exp(-\omega Z_0)\right\}^2,$$

wherein $\chi_m$ is susceptibility of the mask, V is the volume of the mask, and $\mu_0$ is the permeability of vacuum.

To ensure the attractive force of the Halbach magnet array 21 on the mask to be uniform as much as possible, optionally, when a relative distance between the mask and the Halbach magnet array 21 varies, a variation $\Delta z$ of the distance between the mask and the Halbach magnet array 21 is maximized in a process that the attractive force applied to the mask is increased from 0.5 time to 10 times of the gravity of the mask. In combination with the above setting condition and the foregoing formula, following formula may be obtained:

$$\Delta z = \frac{\ln 20}{2\omega}.$$

The above formula indicates that the smaller the rotational angular velocity $\omega$ in the magnetization direction is, the larger the variation $\Delta z$ of the distance between the mask and the Halbach magnet array 21 is, and the more slowly the attractive force of the Halbach magnet array 21 on the mask varies.

Further, in combination with existing evaporation requirements, the variation $\Delta z$ of the distance between the mask and the Halbach magnet array 21 should be greater than or equal to a minimum value $\Delta z_{min}$ (5 mm) in the process that the attractive force applied to the mask is increased from 0.5 time to 10 times of the gravity of the mask. In combination with $\Delta z \geq \Delta z_{min}$, the following formula may be obtained:

$$\omega = \frac{\ln 20}{2\Delta z} \leq \omega_{max} = 300 \text{ m}^{-1},$$

$$T \geq 0.02 \text{ m}.$$

When in actual setting, it is needed to ensure that the attractive force of the Halbach magnet array 21 on the mask is greater than or equal to the gravity of the mask in the event that the distance $Z_0$ from the mask to the Halbach magnet array 21 satisfies $\sinh(\omega Z_0)=5$, and following formula may be obtained:

$$\frac{\sin(\omega A/2)}{\omega(A+C)/2} \geq \frac{\exp(\sinh^{-1}(5))}{B_r}\sqrt{\frac{\rho g \mu_0 (1+\chi_m)}{\omega \chi_m}} \approx \frac{10}{B_r}\sqrt{\frac{\rho g \mu_0}{\omega}},$$

wherein the $\rho$ is the density of the mask, and the g is gravitational acceleration.

Further, in the event that the number N of the magnets within one period is large enough (for example, $N \geq 3$), $\sin(\omega A/2) \approx \omega A/2$, following formula may be obtained:

$$\frac{A}{A+C} \geq \frac{10}{B_r}\sqrt{\frac{\rho g \mu_0}{\omega}},$$

$$L \geq -\frac{1}{\omega}\ln\left(1 - \frac{\exp(\sinh^{-1}(5))\omega(A+C)/2}{B_r \sin(\omega A/2)}\sqrt{\frac{\rho g \mu_0(1+\chi_m)}{2\omega \chi_m}}\right).$$

The above formula indicates that to allow each magnet array unit 214 in the Halbach magnet array 21 to preferably balance the gravity of the mask, a duty cycle A/C and the thickness L of the Halbach magnet array should be greater than a certain value. The larger the rotational angular velocity in the magnetization direction is, the larger the duty cycle A/C is, and the thinner the Halbach magnet array 21 may be. In addition, the length T of the magnet array unit 214 along the x-axis direction should satisfy:

$$T \leq \frac{2\pi \chi_m}{\rho g \mu_0 (1+\chi_m)}\left[\frac{B_r}{\exp(\sinh^{-1}(5))}\right]^2 \approx \frac{2\pi}{\rho g \mu_0}\left[\frac{B_r}{10}\right]^2.$$

In conclusion, to allow each magnet array unit 214 in the Halbach magnet array to preferably balance the gravity of the mask, the length T of the magnet array unit 214 satisfies the following formula:

$$0.02m \leq T \leq \frac{2\pi \chi_m}{\rho g \mu_0(1+\chi_m)}\left[\frac{B_r}{\exp(\sinh^{-1}(5))}\right]^2,$$

wherein $B_r$ is the remnant magnetization of the magnet block 2141, $\rho$ is the density of the mask, g is gravitational acceleration, $\mu_0$ is the permeability of vacuum, and $\chi_m$ is susceptibility of the mask 2141. The thickness L of the magnetic block 2141 satisfies the following formula:

$$L \geq -\frac{1}{\omega}\ln\left(1 - \frac{\exp(\sinh^{-1}(5))\omega(A+C)/2}{B_r \sin(\omega A/2)}\sqrt{\frac{\rho g \mu_0(1+\chi_m)}{2\omega \chi_m}}\right),$$

wherein $\omega$ is the rotational angular velocity in the magnetization direction, and satisfies $\omega=2\pi/T$. The length A of the magnet block and the distance C between two adjacent magnet blocks satisfy:

$$\frac{A}{A+C} \geq \frac{10}{B_r}\sqrt{\frac{\rho g \mu_0}{\omega}}.$$

The mask made from ferromagnetic materials satisfying the above condition is placed inside the evaporating device. The attractive force applied to the mask from the Halbach magnet array 21 is converted into the acceleration, and the acceleration is decomposed along the z-axis and the x-axis directions, so that a component of the acceleration in the z-direction (denoted by a z-direction acceleration) and a component of the acceleration in the x-axis direction (denoted by an x-direction acceleration) may be obtained for the mask.

Figure 8A:
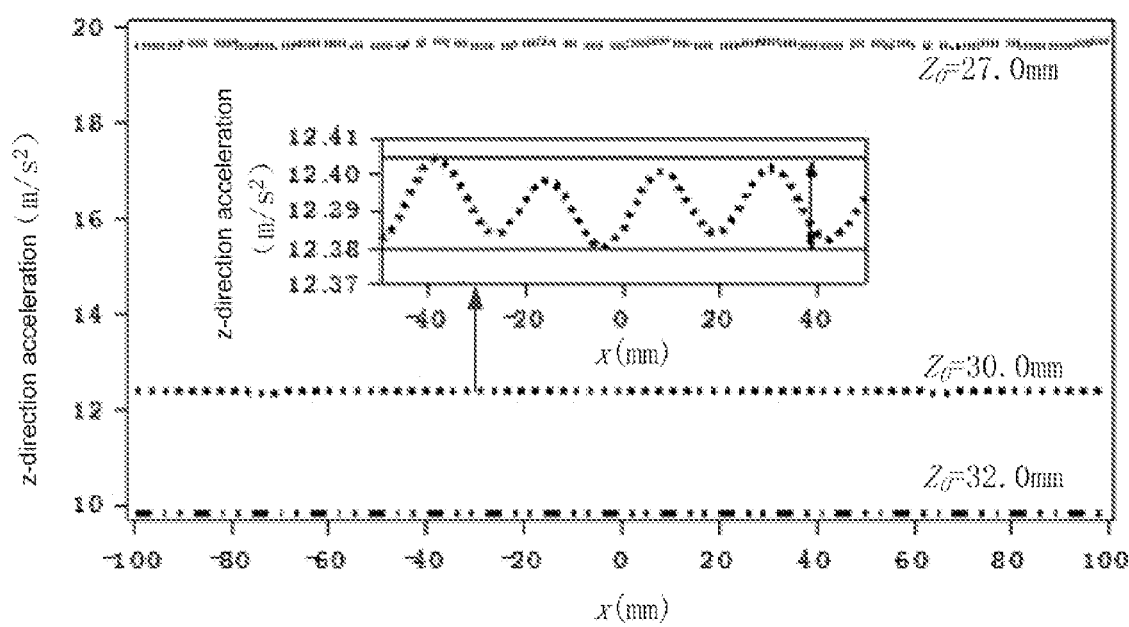
FIG. 8A is a schematic diagram showing distribution of the z-direction acceleration of the mask in the evaporating device in FIG. 7.

FIG. 8*a* is a schematic diagram showing distribution of the z-direction acceleration of the mask in the evaporating device in FIG. 7. In FIG. 8*a*, an abscissa represents an x-axis coordinate, a unit thereof being millimeter (mm); and an ordinate represents the z-direction acceleration of the mask, a unit thereof being meter per second squared (m/s$^2$). Value $Z_0$ represents a distance from the mask to the Halbach magnet array 21. Referring to FIG. 8*a*, at a position where the distance from the Halbach magnet array 21 is 32.0 mm, the z-direction acceleration of the mask is about 10 m/s$^2$, and the attractive force applied to the mask from the Halbach magnet array 21 is approximately equal to the gravity of the mask. At a position where the distance from the Halbach magnet array 21 is 27.0 mm, the z-direction acceleration of the mask is about 19.5 m/s$^2$, and the attractive force applied to the mask from the Halbach magnet array 21 is approximately twice the gravity of the mask. This shows that in the process that the mask continuously moves under the action of the attractive force of the Halbach magnet array 21, the variation of the attractive force applied to the mask by the Halbach magnet array 21 is relatively small.

FIG. 8*a* also includes an inside subgraph. The subgraph is an enlarged view showing distribution of the z-direction acceleration of the mask at positions of different x values when the distance $Z_0$ from the Halbach magnet array 21 is 30.0 mm. As can be seen from the subgraph in FIG. 8*a* at an enlarged scale, along the x-axis direction, although the z-direction acceleration of the mask fluctuates to a certain degree, a difference between a maximum value and an average value of the acceleration is only 0.01 m/s$^2$ which is within an error-allowable range and may be negligible.

Figure 8B:
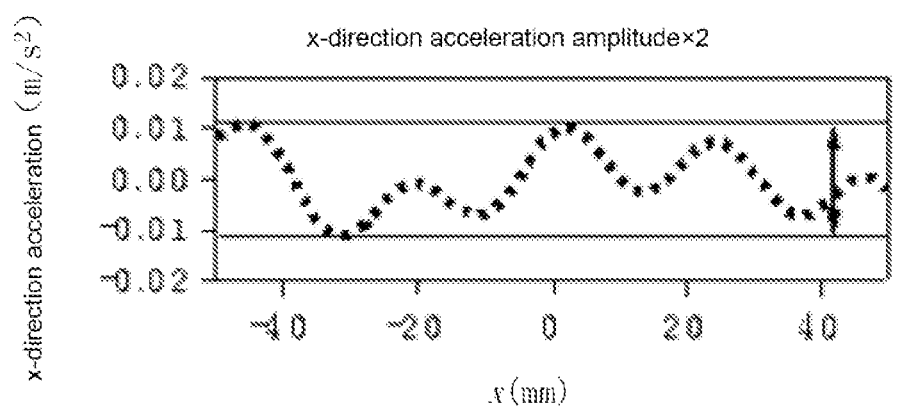
FIG. 8B is a schematic diagram showing distribution of the x-direction acceleration of the mask in the evaporating device in FIG. 7.

FIG. 8*b* is a schematic diagram showing distribution of the x-direction acceleration of the mask in the evaporating device in FIG. 7. In FIG. 8*b*, an abscissa represents the x-direction coordinate, a unit thereof being millimeter (mm), and an ordinate represents the x-direction acceleration of the mask, a unit thereof being meter per second squared (m/s$^2$). It is to be noted that FIG. 8*b* is obtained at a position where the distance from the Halbach magnet array 21 is 30.0 mm. As can be seen from FIG. 8*b*, along the x-axis direction, within an error-allowable range, the x-direction acceleration of the mask is approximately equal to zero, that is, force applied to the mask in the x direction is almost zero.

According to the above technical solution, magnetic fields having different magnetic field strengths are formed at two sides of the Halbach magnet array by using the Halbach magnet array including a plurality of magnet array units whose magnetization direction precesses clockwise or counter-clockwise by 360 degrees, so that the mask setting region is disposed at one side of the Halbach magnet array. Within the mask setting region, the mask made from ferromagnetic material may be subject to an attractive force slowly changing in size that is along a direction away from the Halbach magnet array. Under the combined action of the attractive force and a gravity, the mask hardly deforms, thereby solving the problem of deformation of the mask in the existing evaporating device caused by its own weight having a negative effect on the evaporation effect, and achieving the objective of preventing the mask from deforming due to its own weight and improving the evaporation effect of the evaporating device. Meanwhile, in the process of attracting the mask by the evaporating device provided by the embodiments of the present disclosure to a preset position, a variation of the attractive force of the Halbach magnet array on the mask is smaller along a direction away from the Halbach magnet array, and the attractive force of the Halbach magnet array on the mask is almost zero along a direction parallel to a plane where the Halbach magnet array is, so that the mask may not hit against a glass substrate at a high speed, thereby preventing the mask from damaging and a photo-spacer (PS) from scratching.

When in specific setting, the materials of the Halbach magnet array 21 may be multiple, for example, the Halbach magnet array 21 may be Nd—Fe—B magnet, samarium cobalt magnet, or alnico magnet, etc.

Exemplarily, when the Halbach magnet array 21 is samarium cobalt magnet, to allow each magnet array unit 214 in the Halbach magnet array 21 to preferably balance the gravity of the mask, the length T of the magnet array unit 214 satisfies: 0.02 m≤T≤0.75 m. The thickness L of the magnet block 2141 satisfies: L≥0.131T$^{3/2}$. The length A of the magnet block 2141 and the distance C between two adjacent magnet blocks 2141 satisfy:

$$\frac{A}{A+C} \ge 1.17\sqrt{T}.$$

Advantages of such a setting are as below: under the combined action of the attractive force of the Halbach magnet array 21 on the mask and the gravity of the mask, the mask hardly deforms, thereby solving the problem of deformation of the mask in the existing evaporating device caused by its own weight having a negative effect on the evaporation effect, and achieving the objective of preventing the mask from deforming due to its own weight and improving the evaporation effect of the evaporating device. Meanwhile, in a process of locating the mask in the evaporating device provided by the embodiments of the present disclosure, a variation of force in the vertical direction is smaller, and force in the horizontal direction is almost zero, so that the mask may not hit against a glass substrate at a high speed, thereby preventing the mask from damaging and a photo-spacer (PS) from scratching.

Similarly, when the Halbach magnet array 21 is Nd—Fe—B magnet, to allow each magnet array unit 214 in the Halbach magnet array 21 to preferably balance the gravity of the mask, the length T of the magnet array unit 214 satisfies: 0.02 m≤T≤1.51 m. The thickness L of the magnet block 2141 satisfies: L≥0.0926T$^{3/2}$. The length A of the magnet block 2141 and the distance C between two adjacent magnet blocks 2141 satisfy:

$$\frac{A}{A+C} \ge 0.825\sqrt{T}.$$

Figure 9:
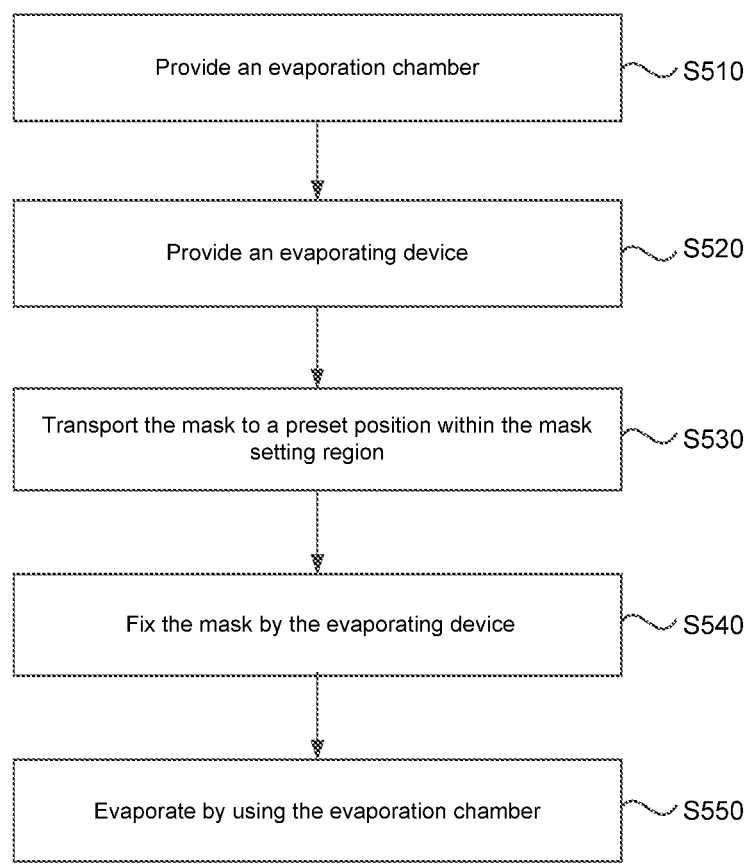
FIG. 9 is a flowchart of an evaporating method according to an embodiment of the present disclosure.

Based on the foregoing evaporating device, an embodiment of the present disclosure further provides an evaporating method. FIG. 9 is a flowchart of an evaporating method according to an embodiment of the present disclosure. Referring to FIG. 9, the evaporating method includes following steps:

S510: providing an evaporation chamber.

S520: providing an evaporating device. The evaporating device includes: a Halbach magnet array and a mask setting region. A magnetization direction of at least part of the Halbach magnet array precesses clockwise or counter-clockwise, so that magnetic fields having different magnetic field strength are formed at two sides of the Halbach magnet array. The mask setting region is disposed within the magnetic field at one side of the Halbach magnet array.

S530: transporting the mask to a preset position within the mask setting region. Material of the mask is ferromagnetic material.

S540: fixing the mask by the evaporating device. By fixing the mask by the evaporating device of the present disclosure, the problem of deformation of the mask in the existing evaporating device caused by its own weight having a negative effect on the evaporation effect may be solved, and the objective of preventing the mask from deforming due to its own weight and improving the evaporation effect of the evaporating device may be implemented. Meanwhile, in the locating process according to the embodiments of the present disclosure, a variation of force in the vertical direction is smaller, and force in the horizontal direction is almost zero. Therefore, the mask may be prevented from damaging, the photo-spacer (PS) may be prevented from scratching.

S550: conducting evaporating by using the evaporation chamber.

When in specific setting, a plurality of setting solutions may be adopted for the Halbach magnet array. For example, the Halbach magnet array includes at least one magnetized unit, and the magnetization direction of part of the Halbach magnet array corresponding to each magnetized unit continuously precesses clockwise or counter-clockwise by 360 degrees. Alternatively, the Halbach magnet array includes at least one magnet array unit, the magnet array unit is composed of a plurality of magnet blocks having different magnetization directions. The magnetization direction of each of the magnet blocks in the magnet array unit is different, and along an arrangement direction of each of the magnet blocks, the magnetization direction of the each of the magnet blocks continuously precesses clockwise or counter-clockwise throughout 360 degrees.

In conclusion, according to the evaporating method provided by the embodiments of the present disclosure, magnetic fields with specific distribution are formed at two sides of the Halbach magnet array, and the mask setting region is disposed within the magnetic field at one side of the Halbach magnet array. Within the mask setting region, the mask made from ferromagnetic material may be subject to an attractive force slowly changing in size that is along a direction away from the Halbach magnet array. Under the combined action of the attractive force and a gravity, the mask hardly deforms, thereby solving the problem of deformation of the mask in the existing evaporating device caused by its own weight having a negative effect on the evaporation effect, and achieving the objective of preventing the mask from deforming due to its own weight and improving the evaporation effect of the evaporating device. Meanwhile, in the process of attracting the mask by the evaporating device provided by the embodiments of the present disclosure to a preset position, a variation of the attractive force of the Halbach magnet array on the mask is smaller along a direction away from the Halbach magnet array, and the attractive force of the Halbach magnet array on the mask is almost zero along a direction parallel to a plane where the Halbach magnet array is, so that the mask may not hit against a glass substrate at a high speed, thereby preventing the mask from damaging and a photo-spacer (PS) from scratching.

It is noted that the foregoing embodiments are merely preferred embodiments of the present disclosure and technical principles used thereby. Persons skilled in the art may understand that the present disclosure is not limited to the specific embodiments described herein, and persons skilled in the art may make various obvious changes, readjustments and substitutions without departing from the scope of protection of the present disclosure. Therefore, although reference is made to the present disclosure in more detail in the foregoing embodiments, the present disclosure is not merely limited to the foregoing embodiments, and other more equivalent embodiments may be further included without departing from the conception of the present disclosure, and the scope of the present disclosure depends on the scope of the appended claims.

What is claimed is:

1. An evaporating device, comprising:
   a Halbach magnet array having two sides above and below a plane of the array, wherein a varying magnetic field is generated at the two sides of the Halbach magnet array; and
   a mask parallel to the plane of the Halbach magnet array and having a setting region, wherein the mask is disposed within the varying magnetic field at one side of the Halbach magnet array,
   wherein the Halbach magnet array comprises at least one magnet array unit, the at least one magnet array unit includes a plurality of magnet blocks, each having a magnetization direction at a predetermined angle with respect to a magnetization direction of a neighboring one of the plurality of magnet blocks, and wherein the predetermined angle is less than 90 degrees and greater than or equal to 0 degrees,
   wherein a number of the plurality of magnet blocks in the at least one of the magnet array unit is three,
   wherein the Halbach magnet array is made of materials comprising samarium cobalt magnet;
   wherein a length T of the magnet array unit along the plane of the array satisfies: $0.02 \text{ m} \leq T \leq 0.75 \text{ m}$;
   wherein the magnet block has a thickness L perpendicular to the plane of the array and satisfying: $L \geq 0.131 \ T^{3/2}$; and
   wherein the magnet block has a length A in the plane of the array and a distance C between two adjacent magnet blocks, wherein the length A and the distance C satisfy:

$$\frac{A}{A+C} \geq 1.17\sqrt{T}.$$

2. The evaporating device according to claim 1, wherein the mask is made of materials comprising ferromagnetics.

3. The evaporating device according to claim 1, wherein the magnetized unit along the plane of the array has a length T satisfying a following formula:

$$0.02 m \leq T \leq \frac{2\pi \chi_m B_r^2}{\rho g \mu_0 (1 + \chi_m)},$$

wherein, $B_r$ represents a remnant magnetic field of the magnetized unit, $\rho$ represents a density of a material of the mask, the g represents a gravitational acceleration velocity, the $\mu_0$ represents a vacuum permeability of the evaporating device, the $\chi_m$ represents a susceptibility of the mask material.

4. The evaporating device according to claim 3, wherein a thickness L of the magnetized unit perpendicular to the plane of the array satisfies a following formula:

$$L \geq -\frac{1}{\omega}\ln\left(1 - \frac{1}{B_r}\sqrt{\frac{\rho g \mu_0(1+\chi_m)}{2\omega\chi_m}}\right)$$

wherein the ω represents an angle change per unit length along the magnetized unit in the magnetization direction and satisfies ω=2π/T.

5. The evaporating device according to claim 1, wherein a length T of the magnet array unit in the plane of the array satisfies a following formula:

$$0.02m \leq T \leq \frac{2\pi\chi_m}{\rho g \mu_0(1+\chi_m)}\left[\frac{B_r}{\exp(\sinh^{-1}(5))}\right]^2$$

wherein, the $B_r$ represents a remnant magnetization of the magnet block, the ρ represents a density of a material of the mask, the g represents a gravitational acceleration velocity, the $\mu_0$ represents a vacuum permeability of the evaporating device, the $\chi_m$ represents a susceptibility of the mask material.

6. The evaporating device according to claim 5, wherein a thickness L of the magnet block perpendicular to the plane of the array satisfies a following formula:

$$L \geq -\frac{1}{\omega}\ln\left(1 - \frac{\exp(\sinh^{-1}(5))\omega(A+C)/2}{B_r \sin(\omega A/2)}\sqrt{\frac{\rho g \mu_0(1+\chi_m)}{2\omega\chi_m}}\right),$$

wherein, the ω represents angle change per unit length along the plane of the array and satisfies ω=2π/T, A represents a length of the magnet block along the plane of the array, the C represents a distance between two adjacent magnet blocks.

7. The evaporating device according to claim 6, wherein the length A of the magnet block and the distance C between outer surfaces of two adjacent magnet blocks satisfy a following formula:

$$\frac{A}{A+C} \geq \frac{10}{B_r}\sqrt{\frac{\rho g \mu_0}{\omega}}.$$

8. An evaporating method, comprising:
providing an evaporation chamber;
providing an evaporating device, wherein the evaporating device comprises:
a Halbach magnet array having two sides above and below a plane of the array, wherein a varying magnetic field is generated at two sides of the Halbach magnet array; and
a mask parallel to the plane of the array and having a setting region, wherein the mask is disposed within the varying magnetic field at one side of the Halbach magnet array, wherein the mask is disposed at either the first side or the second side of the Halbach magnet array, wherein the Halbach magnet array comprises at least one magnetized unit, the at least one magnet array unit includes a plurality of magnet blocks each having a magnetization direction at a predetermined angle with respect to a magnetization direction of a neighboring one of the plurality of magnet blocks, and wherein the predetermined angle is less than 90 degrees and greater than or equal to 0 degrees;
transporting the mask to a preset position within the mask setting region, wherein the mask is made of ferromagnetic material;
fixing the mask to the evaporating device; and
conducting evaporation by using the evaporation chamber;
wherein a number of the plurality of magnet blocks in the at least one magnet array unit is three,
wherein the Halbach magnet array is made of materials comprising samarium cobalt magnet;
wherein the magnet array unit has a length T in the plane of the array satisfying: 0.02 m≤T≤0.75 m;
wherein the magnet block has a thickness L perpendicular to the plane of the array and satisfying: L≥0.131 $T^{3/2}$; and
wherein the magnet block has a length A in the plane of the array and a distance C between two adjacent magnet blocks, wherein the length A and the distance C satisfy:

$$\frac{A}{A+C} \geq 1.17\sqrt{T}.$$

9. An evaporating device, comprising:
a Halbach magnet array having a first side and a second side opposite to the first side, wherein a varying magnetic field is generated at two sides of the Halbach magnet array; and
a mask parallel to a plane of the Halbach magnet array, wherein the mask is disposed at either the first side or the second side of the Halbach magnet array,
wherein the Halbach magnet array comprises at least one magnetized unit, each of the at least one magnetized unit has a plurality of magnetization directions, each configured at a predetermined angle with respect to a magnetization direction of a neighboring one of the plurality of magnet blocks, and wherein the predetermined angle is less than 90 degrees and greater than or equal to 0 degrees,
wherein the Halbach magnet array is made of materials comprising samarium cobalt magnet;
wherein the magnet array unit has a length T in the plane of the array satisfying: 0.02 m≤T≤0.75 m;
wherein the magnet block has a thickness L perpendicular to the plane of the array and satisfying: L≥0.131 $T^{3/2}$; and
wherein the magnet block has a length A in the plane of the array and a distance C between two adjacent magnet blocks, wherein the length A and the distance C satisfy:

$$\frac{A}{A+C} \geq 1.17\sqrt{T}.$$

10. The evaporating device according to claim 9, wherein the mask is made of materials comprising ferromagnetics.

11. The evaporating device according to claim 9, wherein each of the plurality of magnetization directions is inclined by the predetermined angle in clockwise or counter-clockwise with respect to the previous one of the plurality of magnetization directions.

* * * * *